(12) United States Patent
Sauciuc et al.

(10) Patent No.: US 7,031,155 B2
(45) Date of Patent: Apr. 18, 2006

(54) ELECTRONIC THERMAL MANAGEMENT

(75) Inventors: Ioan Sauciuc, Phoenix, AZ (US); Gregory M. Chrysler, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 166 days.

(21) Appl. No.: 10/337,909

(22) Filed: Jan. 6, 2003

(65) Prior Publication Data

US 2004/0253130 A1    Dec. 16, 2004

(51) Int. Cl.
*H05K 7/20* (2006.01)
*H01L 23/467* (2006.01)

(52) U.S. Cl. .................. 361/695; 361/697; 257/722

(58) Field of Classification Search ............... 361/678, 361/690, 694, 695, 697; 165/80.3, 122, 104.34, 165/80.4; 454/184–186; 257/712–722; 312/236, 223.1, 223.2, 223.3; 310/311–371; 417/410.1, 436
See application file for complete search history.

(56) References Cited

U.S. PATENT DOCUMENTS

| | | | | |
|---|---|---|---|---|
| 4,595,338 A | * | 6/1986 | Kolm et al. ................. 416/81 |
| 4,751,713 A | * | 6/1988 | Affleck .......................... 372/59 |
| 4,780,062 A | * | 10/1988 | Yamada et al. ............ 417/410.2 |
| 4,834,619 A | * | 5/1989 | Walton ......................... 417/53 |
| 4,923,000 A | * | 5/1990 | Nelson ........................ 165/122 |
| 5,008,582 A | * | 4/1991 | Tanuma et al. .............. 310/332 |
| 5,381,950 A | * | 1/1995 | Aldridge ..................... 236/1 R |
| 5,634,351 A | * | 6/1997 | Larson et al. ............... 62/259.2 |
| 5,861,703 A | * | 1/1999 | Losinski ...................... 310/330 |
| 5,921,757 A | * | 7/1999 | Tsutsui et al. ............ 417/410.2 |
| 6,078,502 A | * | 6/2000 | Rostoker et al. ............. 361/723 |
| 6,353,295 B1 | * | 3/2002 | Sridhar et al. ............... 315/248 |
| 6,469,381 B1 | | 10/2002 | Houle et al. |
| 6,549,407 B1 | | 4/2003 | Sauciuc et al. |
| 6,561,267 B1 | | 5/2003 | Sauciuc et al. |

(Continued)

FOREIGN PATENT DOCUMENTS

JP        04065864 A  *  3/1992

OTHER PUBLICATIONS

Sauciuc, I., et al., "Spreading in the Heat Sink Base: Phase Change Systems or Solid Metals??," IEEE Transactions on Components and Packaging Technologies, vol. 25, No. 4, Dec. 2002, pp. 621-628.

*Primary Examiner*—Anatoly Vortman
(74) *Attorney, Agent, or Firm*—Schwabe, Williamson & Wyatt, P.C.

(57) ABSTRACT

Piezoelectric fan assemblies are provided to provide a conduction path and forced convection for space-limited electronic devices in accordance with embodiments of the present invention. The fan blade of a piezoelectric fan is thermally coupled to the heat source, such as, but not limited to, the fins of a heat sink, the condenser of the heat pipe, and to the thermal mass of a heat spreader or block. The high amplitude resonant vibration of the fan blade causes formation of a high velocity unidirectional flow stream. Maximum airflow occurs on axes of the piezoelectric fan's centerline, relative to both width and height dimensions. Air intake is above and below the swept out plane of the fan blade. The air flow provides forced convection for the fan blade and, secondarily, for the heat source.

19 Claims, 4 Drawing Sheets

U.S. PATENT DOCUMENTS

| | | |
|---|---|---|
| 6,609,561 B1 | 8/2003 | Sauciuc et al. |
| 6,636,423 B1 | 10/2003 | Rinella et al. |
| 6,639,799 B1 | 10/2003 | Prasher et al. |
| 6,646,874 B1 | 11/2003 | Pokharna et al. |
| 6,650,542 B1 | 11/2003 | Chrysler et al. |
| 6,653,730 B1 | 11/2003 | Chrysler et al. |
| 6,661,660 B1 | 12/2003 | Prasher et al. |
| 6,706,562 B1 | 3/2004 | Mahajan et al. |
| 6,713,942 B1 * | 3/2004 | Raman et al. ......... 310/316.01 |
| 6,770,966 B1 | 8/2004 | Chrysler et al. |
| 6,785,134 B1 | 8/2004 | Maveety et al. |
| 6,795,311 B1 | 9/2004 | Pokharna et al. |
| 2002/0074649 A1 | 6/2002 | Chrysler et al. |
| 2002/0080584 A1 | 6/2002 | Prasher et al. |
| 2003/0081383 A1 | 5/2003 | Rinella et al. |
| 2004/0070943 A1 | 4/2004 | Chrysler et al. |
| 2004/0082188 A1 | 4/2004 | Chrysler et al. |
| 2004/0187501 A1 | 9/2004 | Sauciuc et al. |
| 2004/0188817 A1 | 9/2004 | Hua et al. |

* cited by examiner

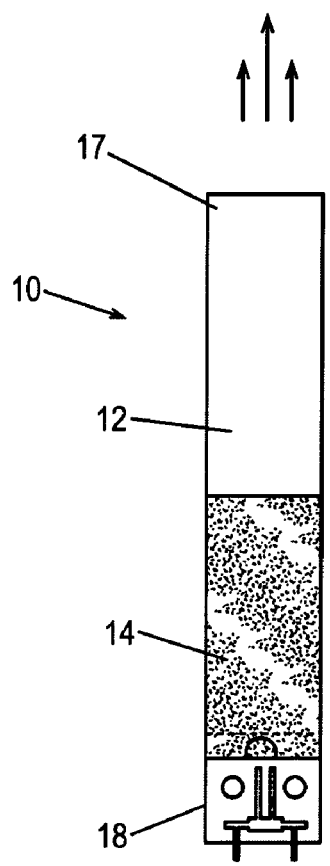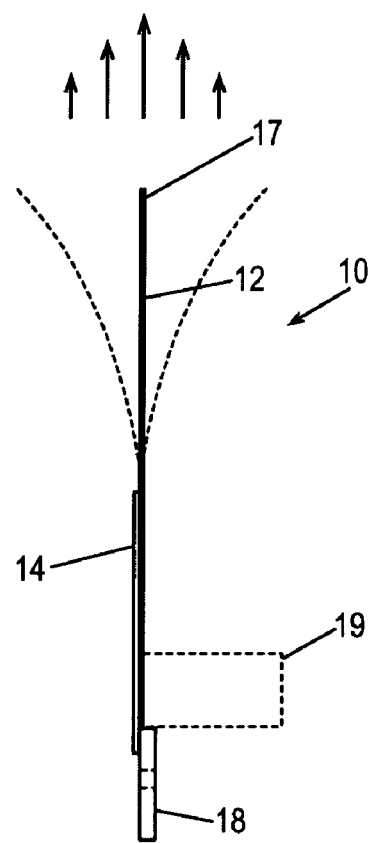
FIG. 1A   FIG. 1B
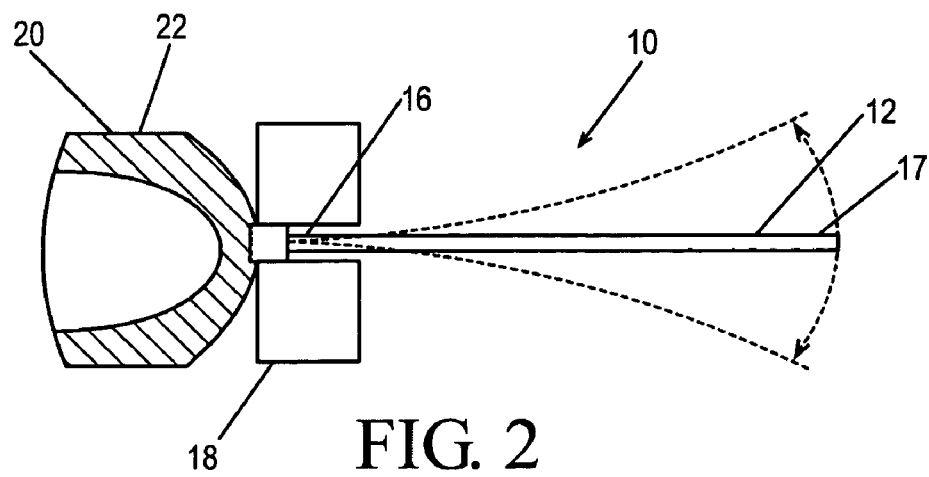
FIG. 2

ELECTRONIC THERMAL MANAGEMENT

FIELD OF THE INVENTION

The present invention relates to the thermal management of electronic components and, more particularly, to forced convection using vibrating blades.

BACKGROUND OF INVENTION

Many of today's electronic goods contain one or more electronic components that operate at elevated temperature requiring some type of thermal management system. By way of example, portable computers and wireless phones have one or more microelectronic packages that generate a considerable amount of thermal energy dissipated as heat. An example of a microelectronic package is an integrated circuit microprocessor, an example of which is a central processing unit (CPU) for the computer system.

In some cases, the heat can be managed with a thermally coupled heat sink, which provides a large surface area for dissipation of heat through convection. Heat sinks are generally formed from a material having a high thermal conductivity. Heat sinks couple with the microelectronic package and comprises a plurality of fins or pins through which air may pass to dissipate the heat. In many cases, a fan is attached to the heat sink to provide forced convection for more efficient heat dissipation.

With the drive for smaller electronic products, the available space is very limited to house a heat sink and fan. In some cases the heat sink is remotely located or a different thermal management solution used. For example, in some portable computers, such as laptop computers, heat generated from the electronic components is carried via heat pipe to a remote heat sink, commonly located in the hinge connecting the display to the base.

In some cases, the heat dissipation device is a flat plate known as a heat spreader. The amount of thermal dissipation remains limited in these devices due to high thermal resistance related to the thermal mass of a solid metal plate and the limited efficiencies of passive convection.

In yet another example, the microelectronic components within a wireless phone generate significant amounts of heat during use that must be dissipated to prevent damage. The concentrated heating and small size of the enclosure make thermal management a significant issue in wireless phone design.

New apparatus and methods are needed for providing thermal management of space-limited electronic devices. They must provide for small scale integration, be capable of managing the thermal requirements of the electronic device, not significantly impact the electrical power consumption of the device, and be inexpensive to manufacture.

BRIEF DESCRIPTION OF DRAWINGS

FIGS. 1A and 1B are top and side views a piezoelectric fan in accordance with an embodiment of the present invention;

FIG. 2 is a top view of the piezoelectric fan in FIG. 1 thermally coupled to a heat dissipation device, in accordance with an embodiment of the present invention;

DESCRIPTION

Figure 3:
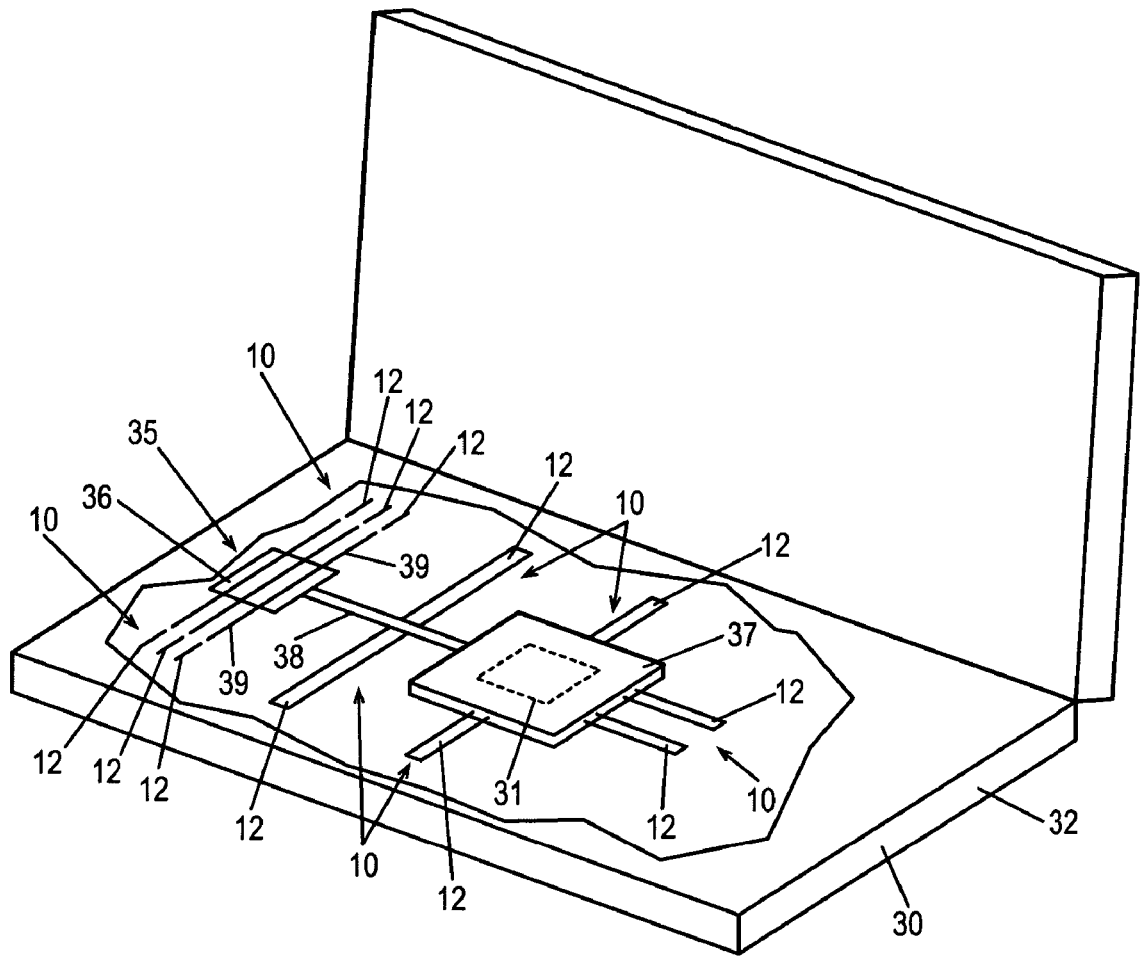
FIG. 3 is a perspective, partially cut-away view of a portable computer provided with one or more piezoelectric fans, in accordance with an embodiment of the method of the present invention.

In the following detailed description, reference is made to the accompanying drawings which form a part hereof wherein like numerals designate like parts throughout, and in which is shown by way of illustration specific embodiments in which the invention may be practiced. It is to be understood that other embodiments may be utilized and structural or logical changes may be made without departing from the scope of the present invention. Therefore, the following detailed description is not to be taken in a limiting sense, and the scope of the present invention is defined by the appended claims and their equivalents.

Piezoelectric fans are provided to facilitate conduction and forced convection for heat dissipation for space-limited electronic devices in accordance with embodiments of the present invention. The fan blade of a piezoelectric fan is thermally coupled to the heat dissipation portion of the thermal management system, such as, but not limited to, the fins of a heat sink, the condenser of a heat pipe, and to the thermal mass of a heat spreader or heat block.

FIGS. 1A and 1B are top and side views a piezoelectric fan 10 in accordance with an embodiment of the present invention. The piezoelectric fan 10 comprises a fan blade 12 with one or more piezoelectric films 14 at a fixed end 16 where the fan blade 12 is fixed with a fan base 18. The fan blade 12 is thermally coupled to a portion of a heat dissipation device 19 (shown in phantom).

Piezoelectric fans 10 an oscillating fan blade 12 that are driven at resonance by a piezoelectric bending element. The piezoelectric bending element, such as a piezoceramic film, has operating characteristics such that when stressed electrically by a voltage, its dimensions change. This dimensional change is used to produce bending in the piezoelectric film 14 that also causes the attached fan blade 12 to bend. Bending in alternating directions causes the fan blade 12 to oscillate or vibrate. In free air, high amplitude resonant vibration of the fan blade 12 causes formation of a high velocity unidirectional flow stream. Maximum airflow occurs on axes of the piezoelectric fan's 10 centerline, relative to both width and height dimensions. Air intake is above and below the swept out plane of the fan blade 12. The simple design of the piezoelectric fan 10 lends itself to low cost, high volume production.

Piezoelectric fans 10 offer advantages over conventional fan technology. These include good applicability for spot cooling; ultra-light weight; and profile. They produce almost no heat of their own making them ideal for selected enclosures.

FIG. 2 is a side view of the piezoelectric fan 10 in FIG. 1 in accordance with an embodiment of the present invention. The piezoelectric fan 10 is thermally coupled to a portion of a heat dissipation device 20, illustrated as a tip 22 of a heat sink fin. The fan blade 12 comprises a flexible thermally conductive material adapted to conduct heat away from the heat dissipation device 20. The oscillating motion of the fan blade 12 provides forced convection of heat to the environment.

The fan blade 12 is thermally coupled to the heat dissipation device 20 being cooled. The fixed end 16 of the fan blade 12 is coupled to a heat dissipation device 20 using a process, such as, but not limited to, soldering, thermal conductive 10 adhesive, and brazing. The motion of the free end 17 of the fan blade 12 enhances the convective heat transfer rate from the fan blade 12 and, secondarily, the heat dissipation device 20 upon which it is thermally coupled.

It is acknowledged that small enclosures, such as those associated with portable computers and wireless phones, have little space available for the heat dissipation device 20. However, there are still some remote areas available for a low profile heat dissipation device 20 such as a heat spreader in the form of a thin plate of conductive material. The heat spreader is thermally coupled with the one or more heat producing components. The heat spreader provides a relatively large, broad surface from which heat can be convected therefrom. A heat spreader is generally effective, though, only if subjected to forced convection.

FIG. 3 is a perspective, partially cut-away view of a portable computer 30 provided with one or more piezoelectric fans 10, in accordance with an embodiment of the method of the present invention. The portable computer 30 comprises a heat dissipation device 35 thermally coupled to one or more heat-producing microelectronic devices 31. The heat dissipation device 35 comprises a heat spreader 37, a heat pipe 38 and a heat sink 36, which are known in the art. One or more piezoelectric fans 10 are coupled to the heat dissipation device 35 in one or more locations. In one embodiment, the fan blade 12 of one or more piezoelectric fans 10 are thermally coupled to the periphery of the heat spreader 37. In another embodiment, the fan blade 12 of one or more piezoelectric fans 10 is thermally coupled to the heat pipe 38. In yet another embodiment, the fan blade 12 of one or more piezoelectric fans 10 is thermally coupled to the heat spreader 37, the heat pipe 38, and the heat sink fins 39.

The fan blade 12 of the one or more piezoelectric fans 10 conducts heat from the heat dissipation device 35 to the surrounding air. The oscillating movement of the fan blade 12 through the surrounding air forced convection for the fan blade 12. The extra air movement provided by the piezoelectric fans 10 reduces the total thermal resistance of the heat dissipation device 35.

Figure 4:
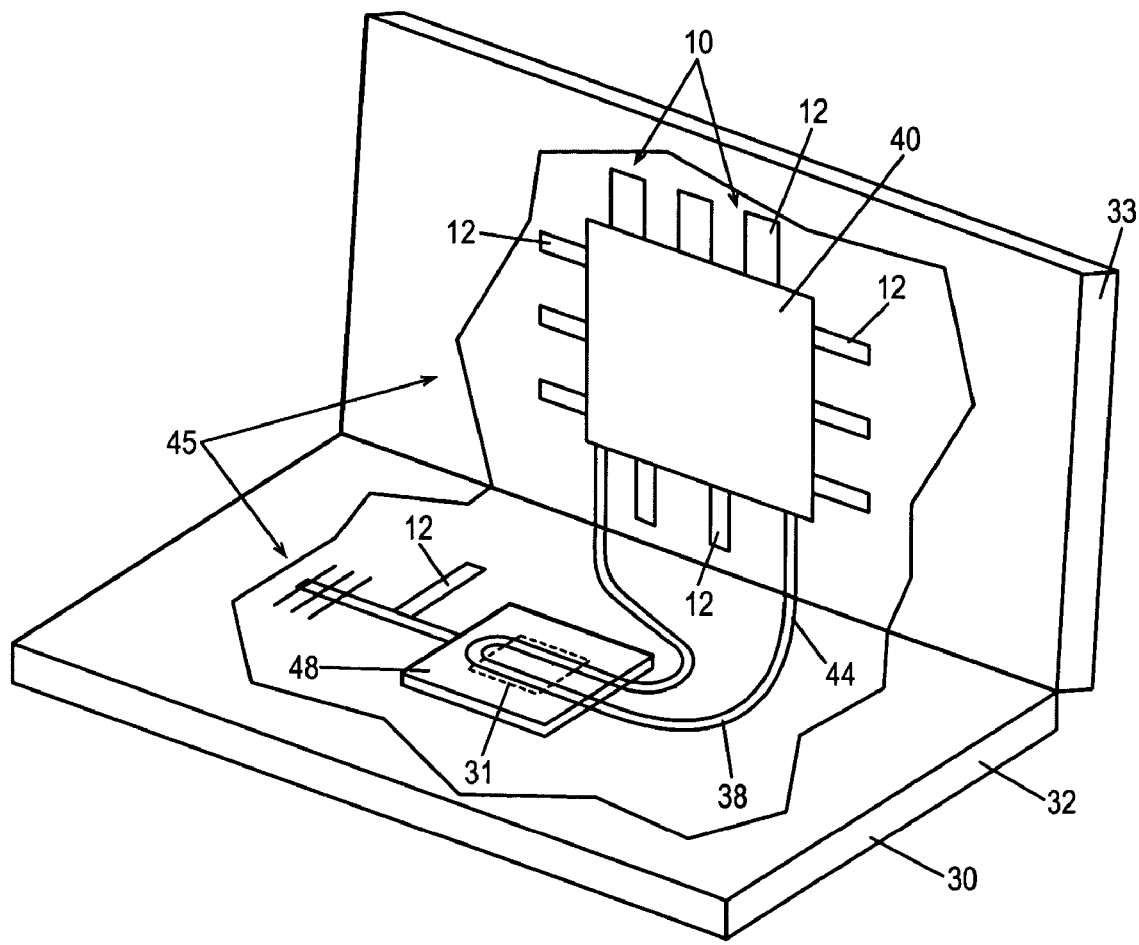
FIG. 4 is a perspective, partially cut-away view of a portable computer provided with one or more piezoelectric fans, in accordance with an embodiment of the method of the present invention.

FIG. 4 is a perspective, partially cut-away view of a portable computer 30 provided with one or more piezoelectric fans 10, in accordance with an embodiment of the method of the present invention. A display section 33 of the portable computer 30 presents a location to house components of a heat dissipation device 45. In one embodiment in accordance with the present invention, the heat dissipation device 45 comprises an evaporator 48 in the base section 32 thermally coupled with one or more microelectronic devices 31, interconnected in a continuous loop with a flat plate vapor chamber 40 located behind the display screen (not shown) in the display section 33, with flexible connections 44 between the evaporator 48 in the base section 32 and the vapor chamber 40 in the display section 33 hingedly coupled to the base section 32.

The fan blades 12 of one or more piezoelectric fans 10 are thermally interconnected about the periphery of the vapor chamber 40. The fan blades 12 conduct heat from the vapor chamber 40, and the oscillation of the fan blades 12 provides forced convection of the heat from the fan blade 12 and, secondarily, from the vapor chamber 40.

The evaporator 48 includes, but not limited to, oscillating heat pipe or conventional heat pipe, to move thermal energy from the evaporator 48 to the vapor chamber 40. Evaporators 48 and vapor chambers 40 are known in the art and commonly contain a cooling fluid, such as water, fluorocarbon liquid, freon, silicone fluid, and the like (not shown), which transports thermal energy from the evaporator to the vapor chamber.

Figure 5:
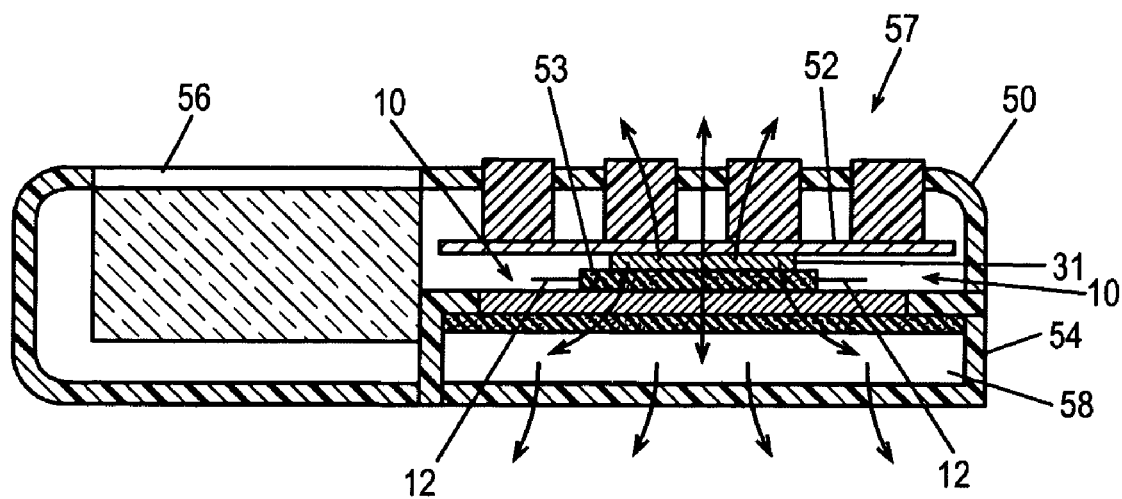
FIGS. 5 and 6 are cross-sectional views of a wireless phone provided with one or more piezoelectric fans, in accordance with embodiments of the method of the present invention.

FIG. 5 is a cross-sectional view of a wireless phone 50 provided with one or more piezoelectric fans 10, in accordance with an embodiment of the method of the present invention. The wireless phone 50 comprises an enclosure 54, display electronics 56, a battery 58, a keypad 57, and a circuit substrate 52. The very small volume within a wireless phone enclosure 54 requires efficient utilization of space to contain the various components.

The circuit substrate 52 provides mounting and electrical interconnection for the microelectronic package 31. Heat from the microelectronic package 31 is conducted to the circuit substrate 52 that is made thermally conductive for that purpose. Heat is then released by convection to the environment. However, heat dissipation from the circuit substrate 52 is less effective as the size of the circuit substrate 52 is reduced for the smaller sizes of wireless phones. Further, the limited space inside the enclosure 54 is not, by itself, sufficient to support thermal convection of the heat produced by advanced microelectronic packages 31.

In an embodiment in accordance with the present invention, the microelectronic package 31 is thermally interconnected with a heat spreader 53, and the heat spreader 53 is provided with one or more piezoelectric fans 10 about the periphery. The fan blades 12 of the piezoelectric fans 10 are thermally coupled with the heat spreader 53, such that heat is conducted from the microelectronic device 31 to the heat spreader 53 and from the heat spreader 53 to the fan blade 12 and dissipated by convection to the environment by the oscillating fan blade 12. Secondarily, the air flow will provide convective cooling on the heat spreader 53 and circuit substrate 52.

Figure 6:
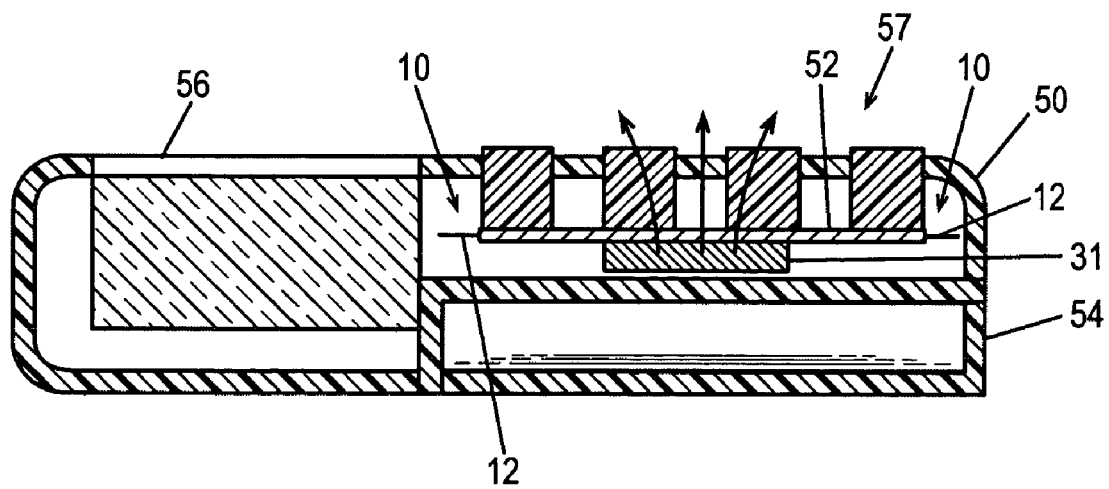

FIG. 6 is a cross-sectional view of a wireless phone 50 provided with one or more piezoelectric fans 10 thermally coupled to the circuit substrate 52. The fan blades 12 are thermally coupled about the periphery of the heat conductive circuit substrate 52 such that heat is conducted from the microelectronic device 31 to the circuit substrate 52 and from the circuit substrate 52 to the fan blade 12 and dissipated by convection to the environment by the oscillating fan blade 12. Secondarily, the air flow will provide convective cooling for the circuit substrate 52.

Piezoelectric fans have very low power requirements to drive the fan blade into oscillation. Also, piezoelectric fans present a low profile whether idle or in operation, and therefore, are ideally suited for limited space situations.

Piezoelectric fans used in accordance with embodiments of the present invention significantly reduce the heat dissipation device thermal resistance ($\theta_{sa}$) for applications such as, but not limited to, portable computers and wireless phones, as they effectively provide either a parallel path or additional surface area for heat dissipation through heat conduction and provide forced convention.

Thermally conductive components discussed herein, including, but not limited to, the fan blade, heat spreader, evaporator, vapor chamber, heat pipe, and heat sink, are fabricated from thermally conductive material, such as, but not limited to, copper, copper alloys, aluminum, and aluminum alloys.

Although specific embodiments have been illustrated and described herein for purposes of description of the preferred embodiment, it will be appreciated by those of ordinary skill in the art that a wide variety of alternate and/or equivalent implementations calculated to achieve the same purposes may be substituted for the specific embodiment shown and described without departing from the scope of the present invention. Those with skill in the art will readily appreciate that the present invention may be implemented in a very wide variety of embodiments. This application is intended to cover any adaptations or variations of the embodiments discussed herein. Therefore, it is manifestly intended that this invention be limited only by the claims and the equivalents thereof.

What is claimed is:

1. An apparatus, comprising:
a heat source to generate heat;
a heat dissipation component thermally coupled to the heat source, the heat dissipation component having a planar shaped component defined by a first and a second surface, the first and the second surfaces being parallel to each other and bordered by at least one end, the first and second surfaces having surface areas greater than the at least one end, the planar shaped heat dissipation component to receive and transfer the generated heat away from the heat source; and
a piezoelectric fan coupled to the at least one end of the planar shaped heat dissipation component, the piezoelectric fan to facilitate dissipation of the transferred heat from the heat source, the piezoelectric fan having a substantially planar shape with a first and a second end, the first end being coupled to the at least one end of the heat dissipation component and the second end being located away from the at least one end of the heat dissipation component relative to the first end.

2. The apparatus of claim 1, wherein the first surface of the planar shaped heat dissipation component is located along a plane and the piezoelectric fan extends outwardly from the at least one end of the heat dissipation component in a direction that is substantially parallel with the plane.

3. The apparatus of claim 1, wherein the piezoelectric fan includes a blade, at least a portion of the blade coupled to a piezoelectric film element.

4. The apparatus of claim 1, wherein the apparatus is a laptop computer.

5. The apparatus of claim 4, wherein the planar shaped heat dissipation component is a vapor chamber.

6. The apparatus of claim 4, wherein the planar shaped heat dissipation component is coupled to the heat source via at least one component selected from the group consisting of a heat sink, evaporator and heat pipe.

7. The apparatus of claim 4, wherein the planar shaped heat dissipation component is located at a display section and the heat source is located at a base section.

8. The apparatus of claim 7, wherein the heat source located at the base section is flexibly coupled to the planar shaped heat dissipation component located at the display section by a heat pipe at a bendable point where the base section is coupled to the display section.

9. The apparatus of claim 1, wherein the apparatus is a wireless phone.

10. The apparatus of claim 9, wherein the heat source having a third surface, the third surface being substantially parallel to the first surface and coupled at least partially to the first surface of the heat dissipation component, the first surface having a surface area that is greater than the third surface of the heat source.

11. The apparatus of claim 9, wherein the planar shaped heat dissipation component is a component selected from the group consisting of a heat spreader and a circuit substrate.

12. The apparatus of claim 1, wherein the heat source is a microelectronic package.

13. A method of operation for dissipating heat remotely from a heat source in an electronic device, comprising:
generating heat from the heat source;
transferring the generated heat to a planar shaped heat dissipation component, the planar shaped heat dissipation component having a planar shaped component having a first and a second surface that are substantially parallel to each other and bordered by at least one end, the first and second surfaces having surface areas greater than the at least one end; and
dissipating the transferred heat from the planar shaped heat dissipation component by energizing at least a portion of a piezoelectric fan coupled to the at least one end of the planar shaped heat dissipation component, the piezoelectric fan having a planar shape with a first end and a second end, the first end being coupled to the at least one end of the heat dissipation component and the second end being a free end located away from the at least one end of the heat dissipation component relative to the first end, and the second end of the piezoelectric fan oscillating when the at least a portion of the piezoelectric fan is energized to facilitate the dissipation of the transferred heat from the heat dissipation component.

14. The method of claim 13, wherein the electronic device is a lap top computer and said transferring comprises of transferring the generated heat to the planar shaped heat dissipation component through at least one component selected from the group consisting of a heat sink, evaporator and heat pipe.

15. The method of claim 13, wherein the electronic device is a wireless phone and said transferring comprises of transferring the generated heat to a planar shaped heat dissipation component selected from the group consisting of a heat spreader and circuit substrate.

16. The method of claim 15, wherein the heat source includes a third surface, the third surface with a smaller surface area than the first surface of the planar shaped heat dissipation component, the third surface is substantially parallel to the first surface and at least partially coupled to the first surface, and wherein said transferring comprises transferring the generated heat from the third surface to at least a portion of the first surface of the planar shaped heat dissipation component.

17. The method of claim 13, wherein the piezoelectric fan comprises of a blade that is at least partially coupled to a piezoelectric film element and said dissipating comprises energizing the piezoelectric film element.

18. The method of claim 13, wherein the piezoelectric fan comprises of a blade and said dissipating comprises of oscillating the blade.

19. The method of claim 18, wherein said oscillating the blade to facilitate air circulation around the blade.

* * * * *

UNITED STATES PATENT AND TRADEMARK OFFICE
CERTIFICATE OF CORRECTION

PATENT NO. : 7,031,155 B2  
APPLICATION NO. : 10/337909  
DATED : April 18, 2006  
INVENTOR(S) : Sauciuc et al.

Page 1 of 1

It is certified that error appears in the above-identified patent and that said Letters Patent is hereby corrected as shown below:

Column 3  
Lines 4-5, "...thermal conductive 10 adhesive,..." should read --...thermal conductive adhesive,...--.

Column 4  
Lines 15, 16, 24 and 26, "...microelectronic package 31..." should read --...microelectronic device 31...--.

Signed and Sealed this

Nineteenth Day of June, 2007

JON W. DUDAS  
*Director of the United States Patent and Trademark Office*